United States Patent
Kim et al.

(10) Patent No.: US 9,275,688 B2
(45) Date of Patent: Mar. 1, 2016

(54) SEMICONDUCTOR DEVICE AND SEMICONDUCTOR PACKAGE

(71) Applicant: SAMSUNG ELECTRONICS CO., LTD., Suwon-Si, Gyeonggi-Do (KR)

(72) Inventors: Tae-Sun Kim, Seongnam-Si (KR); Kyoung-Mook Lim, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 4 days.

(21) Appl. No.: 14/211,033

(22) Filed: Mar. 14, 2014

(65) Prior Publication Data

US 2014/0268979 A1 Sep. 18, 2014

(30) Foreign Application Priority Data

Mar. 15, 2013 (KR) ........................ 10-2013-0027658

(51) Int. Cl.

| | |
|---|---|
| *G11C 5/06* | (2006.01) |
| *H01L 25/065* | (2006.01) |
| *H01L 25/18* | (2006.01) |
| *G11C 5/02* | (2006.01) |
| *H01L 23/31* | (2006.01) |
| *H01L 23/00* | (2006.01) |

(52) U.S. Cl.
CPC ............ *G11C 5/06* (2013.01); *G11C 5/025* (2013.01); *H01L 25/0657* (2013.01); *H01L 25/18* (2013.01); *H01L 23/3128* (2013.01); *H01L 24/06* (2013.01); *H01L 24/13* (2013.01); *H01L 24/14* (2013.01); *H01L 24/16* (2013.01); *H01L 2224/0401* (2013.01); *H01L 2224/06136* (2013.01); *H01L 2224/13025* (2013.01); *H01L 2224/14181* (2013.01); *H01L 2224/16145* (2013.01); *H01L 2224/16225* (2013.01); *H01L 2225/06513* (2013.01); *H01L 2225/06517* (2013.01); *H01L 2225/06541* (2013.01); *H01L 2225/06568* (2013.01); *H01L 2924/1432* (2013.01); *H01L 2924/1434* (2013.01); *H01L 2924/15311* (2013.01)

(58) Field of Classification Search
USPC ........................................................ 365/63
See application file for complete search history.

(56) References Cited

U.S. PATENT DOCUMENTS

| | | | |
|---|---|---|---|
| 8,059,443 B2 | 11/2011 | McLaren et al. | |
| 8,207,754 B2 | 6/2012 | Garg et al. | |
| 8,227,904 B2 | 7/2012 | Braunisch et al. | |
| 2006/0067157 A1* | 3/2006 | Ruckerbauer et al. | ........ 365/233 |
| 2006/0140046 A1* | 6/2006 | Koji | .............................. 365/233 |

(Continued)

FOREIGN PATENT DOCUMENTS

KR 20120098096 9/2012

*Primary Examiner* — Anthan Tran

(74) *Attorney, Agent, or Firm* — Volentine & Whitt, PLLC

(57) ABSTRACT

A semiconductor device includes a system-on-chip (SOC) and at least one wide input/output memory device. The SOC includes a plurality of SOC bump groups which provide input/output channels, respectively, independent from each other. The at least one wide input/output memory device is stacked on the system-on-chip to transmit/receive data to/from the system-on-chip through the SOC bump groups. The SOC bump groups are arranged and the at least one wide input/output memory device is configured such that one of the wide input/output memory devices can be mounted to the SOC as connected to all of the SOC bump groups, or such that two wide input/output memory devices can be mounted to the SOC with each of the wide input/out memory devices connected a respective half of the SOC bump groups.

16 Claims, 7 Drawing Sheets

(56) References Cited

U.S. PATENT DOCUMENTS

| | | |
|---|---|---|
| 2010/0140750 A1 | 6/2010 | Toms |
| 2010/0174858 A1 | 7/2010 | Chen et al. |
| 2011/0079923 A1 | 4/2011 | Suh |
| 2011/0161748 A1 | 6/2011 | Casper et al. |
| 2011/0193086 A1 | 8/2011 | Lee et al. |
| 2012/0059984 A1 | 3/2012 | Kang et al. |
| 2012/0153497 A1 | 6/2012 | Lee |
| 2012/0170345 A1* | 7/2012 | Choi et al. ............ 365/51 |

* cited by examiner

SEMICONDUCTOR DEVICE AND SEMICONDUCTOR PACKAGE

PRIORITY STATEMENT

This application claims priority under 35 USC §119 to Korean Patent Application No. 10-2013-0027658, filed on Mar. 15, 2013, in the Korean Intellectual Property Office (KIPO), the contents of which are hereby incorporated by reference in their entirety.

BACKGROUND

1. Technical Field

The inventive concepts generally relate to 3D stacked semiconductor devices. More particularly, the inventive concepts relate to a semiconductor device in which a multi-channel interface type wide input/output memory device is stacked on a system-on-chip (SOC) and to a semiconductor multi-chip package including the same.

2. Description of the Related Art

Recently, a semiconductor device has been developed in which multi-channel interface type wide input/output memory devices have been stacked on a system-on-chip (SOC). The device is provided with through-silicon vias (TSVs) to facilitate the connection of the memory devices to the SOC.

The number of wide input/output memory devices may be increased when the bandwidth of a memory of an SOC needs to be expanded or when a greater integration density is required. However, in those cases it would be considered necessary to expand the region in which the TSVs are provided. Accordingly, SOCs are separately designed for according to each specified bandwidth or integration density.

SUMMARY

According to an aspect of the inventive concept there is provided a semiconductor device in which one or more than one wide input/output memory devices having various densities and/or bandwidths can be/is stacked on a system-on-chip (SOC) having a TSV region of a predetermined size.

To this end, according to an aspect of the inventive concept, there is provided a semiconductor device comprising a system-on-chip (SOC) having a plurality of input/output channels independent from each other; a plurality of memory controllers electrically connected to the input/output channels, respectively, a clock signal generator configured to provide a clock signal to the memory controllers, and a central processing unit (CPU) operatively connected to the clock signal generator and to the memory controllers so as to control an operation of the clock signal generator and operations of the memory controllers. And at least one wide input/output memory device stacked on the system-on-chip, and in which each wide input/output memory device has a substrate, a memory, and memory bumps disposed on a surface of the substrate and electrically connected to the at least one memory array, in which all of the channels of the system-on-chip are electrically connected to respective ones of the memory bumps of the at least one wide input/output memory device such that the at least one wide input/output memory device transmits/receives data to/from the system-on-chip via the memory bumps, in which the total number and layout of the memory bumps of each said at least one wide input/output memory devices are the same as the total number and layout of the SOC bumps of the SOC chip, in which the clock signal generator of the system-on-chip is operative to produce clock signals of various frequencies, and in which the central processing unit of the system-on-chip is configured to set the frequency of the clock signal generated by the clock signal generator in accordance with the number of wide input/output memory devices that are stacked on the system-on-chip.

Also to this end, according to another aspect of the inventive concept, there is provided a semiconductor device comprising a system-on-chip (SOC) having a plurality of input/output channels independent from each other, and at least one wide input/output memory device stacked on the system-on-chip, and in which each wide input/output memory device has a substrate, a memory, and memory bumps disposed on a surface of the substrate and electrically connected to the at least one memory array, in which all of the channels of the system-on-chip are electrically connected to respective ones of the memory bumps of the at least one wide input/output memory device such that the at least one wide input/output memory device transmits/receives data to/from the system-on-chip via the memory bumps, in which the total number and layout of the memory bumps of each said at least one wide input/output memory devices are the same as the total number and layout of the SOC bumps of the SOC chip, and in which each wide input/output memory device further comprises control circuits electrically connected to the memory bumps thereof, respectively, to transmit/receive data to/from the memory bumps, respectively, and a controller configured operatively connected to the control circuits and configured to turn selected ones of the control circuits off based on the number of wide input/output memory devices stacked on the system-on-chip.

According to another aspect of the inventive concepts, there is provided semiconductor device comprising a system-on-chip (SOC) having a plurality of input/output channels independent from each other and having terminal ends, and a plurality of wide input/output memory devices stacked side-by-side on the system-on-chip, and in which each of the wide input/output memory devices has a substrate, a memory, and memory bumps disposed on a surface of the substrate and electrically connected to the at least one memory array, in which some of the memory bumps of each of the wide input/output memory devices are electrically connected to a respective fraction of the channels of the system-on-chip at the terminals ends thereof, whereas others of the memory bumps of each of the wide input/output memory devices are not electrically connected to any of the channels of the system-on-chip and are electrically inactive in the semiconductor device, whereby each of the wide input/output memory devices transmits/receives data to/from the system-on-chip via only some of its memory bumps, and in which the total number and layout of the memory bumps of each of the wide input/output memory devices are the same as the total number and layout of the terminal ends of the input/output channels of the system-on-chip.

BRIEF DESCRIPTION OF THE DRAWINGS

The inventive concepts will be more clearly understood from the following detailed description of preferred embodiments made in conjunction with the accompanying drawings.

DETAILED DESCRIPTION OF THE EMBODIMENTS

Figure 1:
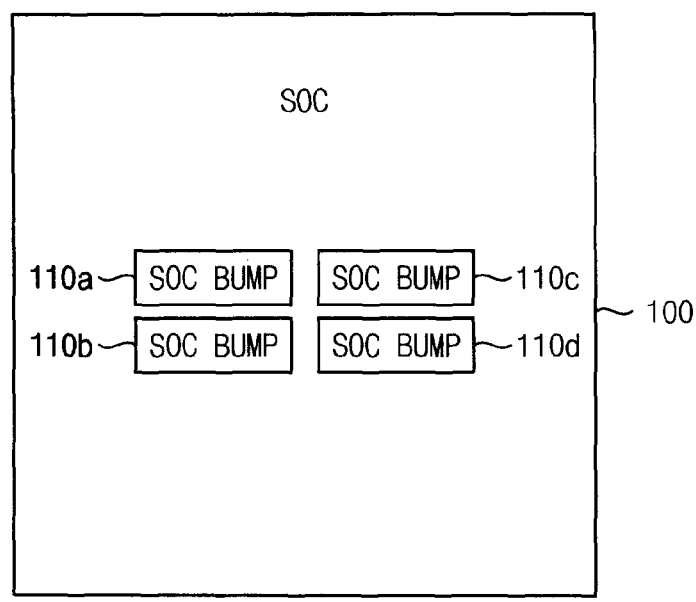
FIG. 1 is a block diagram of a system-on-chip and the one or more wide input/output memory devices that may be integrated in a semiconductor device, according to the inventive concept.
Figure 1:
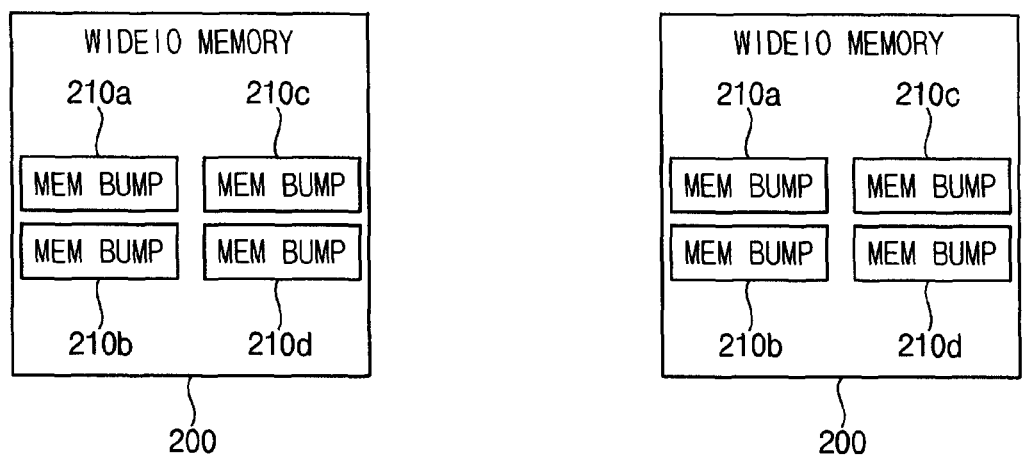

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

Other terminology used herein for the purpose of describing particular examples or embodiments of the inventive concept is to be taken in context. For example, the terms "comprises" or "comprising" when used in this specification specifies the presence of stated features but does not preclude the presence or additional features. Furthermore, the term "connected" will most often be referring to an electrical connection as the context will make clear, although at times the term "connected" may additionally refer to a physical connection. Also, unless as otherwise specified in the written description and/or drawings, such connections may be direct or indirect.

Basic components of a semiconductor device according to the inventive concept will now be described in detail with reference to FIG. 1. The semiconductor device 10 includes a system-on-chip (SOC) 100 and at least one wide input/output memory device 200.

The system-on-chip 100 includes a plurality of SOC bump groups 110a to 110d which provide input/output channels that are independent from each other. Each of the SOC bump groups 110a to 110d may include a plurality of SOC bumps.

The wide input/output memory device 200 includes a plurality of memory cell arrays. Furthermore, the wide input/output memory device 200 includes a plurality of memory bump groups 210a to 210d which are connected to the plurality of memory cell arrays and provide input/output channels which are independent from each other. Each of the memory bump groups 210a to 210d may include a plurality of memory bumps. In the example shown in FIG. 1, the system-on-chip 100 includes first to fourth SOC bump groups 110a to 110d which provide first to fourth input/output channels independent from each other. The total number and layout of the memory bumps of the wide input/output memory device 200 are the same as the total number and layout of the SOC bumps of the system-on-chip 100.

According to one aspect of the inventive concept, the memory bump groups 210 to 210d of the memory devices 200 and the SOC bump groups 110a to 110d of the system-on-chip 10 are numbered and configured such that more than one or just one of the wide input/output memory devices 200 can stacked on the system-on-chip 100 and transmits/receive data to/from the system-on-chip 100 through the plurality of SOC bump groups 110a to 110d. For example, using the above-described components, a first semiconductor device can be fabricated in which one wide input/output memory device 200 is connected to all of the SOC bump groups 110a to 110d to transmit/receive data to/from the system-on-chip 100. Alternatively, a second semiconductor device can be fabricated in which two wide input/output memory devices 200 are connected to all of the SOC bump groups 110a to 110d such that each of the memory devices can independently transmit/receive data to/from the system-on-chip 100.

In either case, however, the system-on-chip 100 can conduct data communications at a high speed because the system-on-chip 100 transmits/receives data to/from at least one wide input/output memory device 200 disposed above the system-on-chip 100 through a plurality of channels which are independent from each other and provided by the SOC bump groups 110a to 110d.

Figure 2:
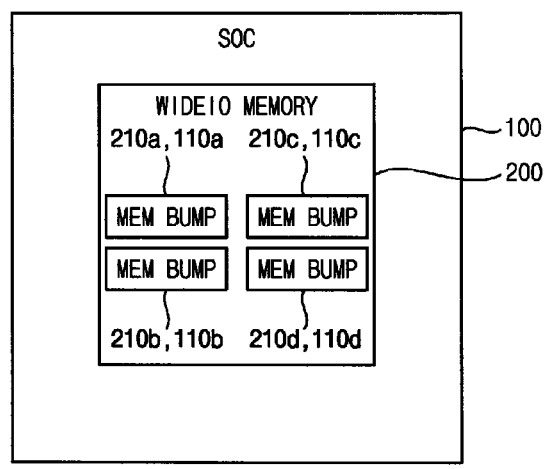
FIG. 2 is a block diagram of one semiconductor device that can be fabricated according to the inventive concept.

FIG. 2 illustrates a semiconductor device 10a of the above-mentioned type in which only one memory device 200 is stacked on and connected to the system-on-chip 100.

Referring to FIG. 2, in this embodiment of a semiconductor device 10a, the first to fourth memory bump groups 210a to 210d are connected to the first to fourth SOC bump groups 110a to 110d of the system-on-chip 100, respectively. Thus, the system-on-chip 100 is connected to the wide input/output memory device 200 through a 4-channel interface.

Figure 3:
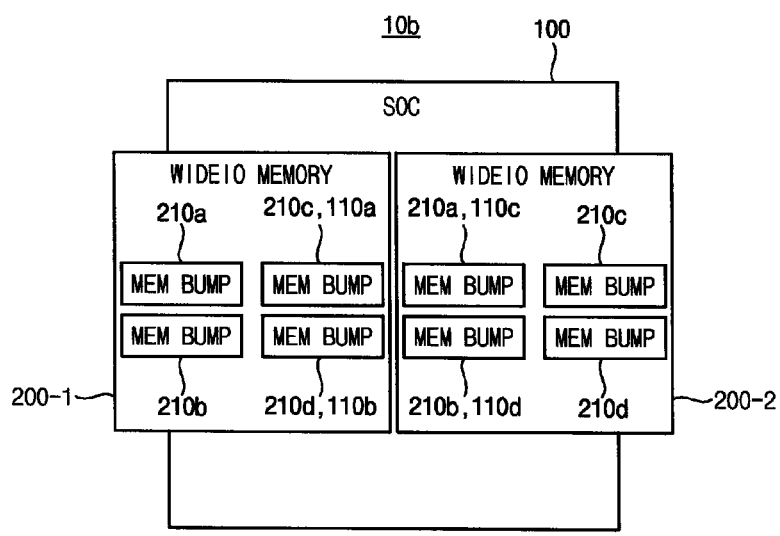
FIG. 3 is a block diagram of another semiconductor device that can be fabricated according to the inventive concept.

FIG. 3 illustrates a semiconductor device 10b of the above-mentioned type in which two of the memory devices 200-1 and 200-2 are stacked side-by-side on and are connected to the system-on-chip 100 independently of each other.

More specifically, in this embodiment of a semiconductor device 10b, two of the memory bump groups 210c and 210d (i.e., half of the memory bump groups) of the first wide input/output memory device 200-1 are connected to two 110a and 110b of the SOC bump groups (i.e., one half of the SOC bump groups) of the system-on-chip 100, respectively. Also, two of the memory bump groups 210a and 210b (i.e., half of the memory bump groups) of the second wide input/output memory device 200-2 are connected to the other two 110c and 110d of the SOC bump groups (i.e., the other half of the SOC bump groups) of the system-on-chip 100. Thus, the system-on-chip 100 is connected to each of the two wide input/output memory devices 200-1 and 200-2 through a respective 2-channel interface.

As is clear from the description above, the total density of the device 10b in which the wide input/output memory devices 200-1 and 200-2 are connected to the system-on-chip 100 is twice that of the device 10a in which just one wide input/output memory device 200 is connected to the system-on-chip 100.

Figure 4:
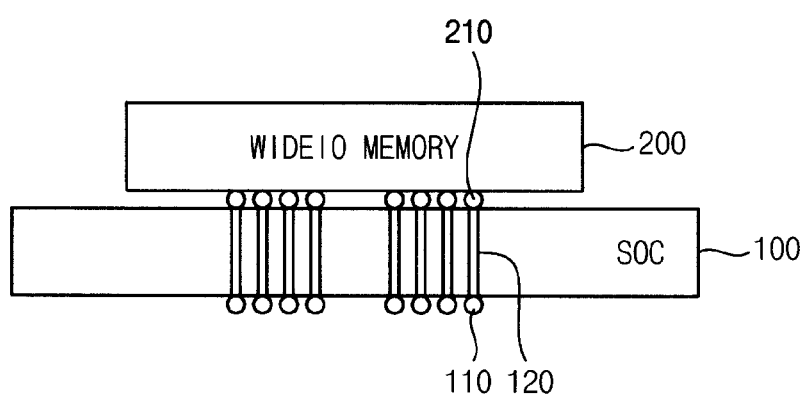
FIG. 4 is a sectional view of a semiconductor device according to the inventive concept, illustrating a connection between the system-on-chip and a wide input/output memory device as applies to either of the devices shown in FIGS. 2 and 3.

An example of the connections between (the circuits of) a system-on-chip and (the memory arrays of) a wide input/output memory device is illustrated in FIG. 4. These connections may be employed in either of the devices 10a and 10b described above with reference to FIGS. 2 and 3.

The connections comprise through-silicon vias (TSVs) 120 extending through the body of (e.g., a substrate of) the system-on-chip 100. Respective ones of the TSVs 120 are connected to the SOC bumps 110, respectively.

Also, as shown in FIG. 4, a wide input/output memory device 200 may be stacked on the system-on-chip 100 through a flip-chip bonding scheme. That is, in this scheme, the memory bumps 210 of the wide input/output memory device 200 are directly connected to the TSVs 120 in electrically connecting the wide input/output memory device 200 to the system-on-chip 100.

Figure 5:
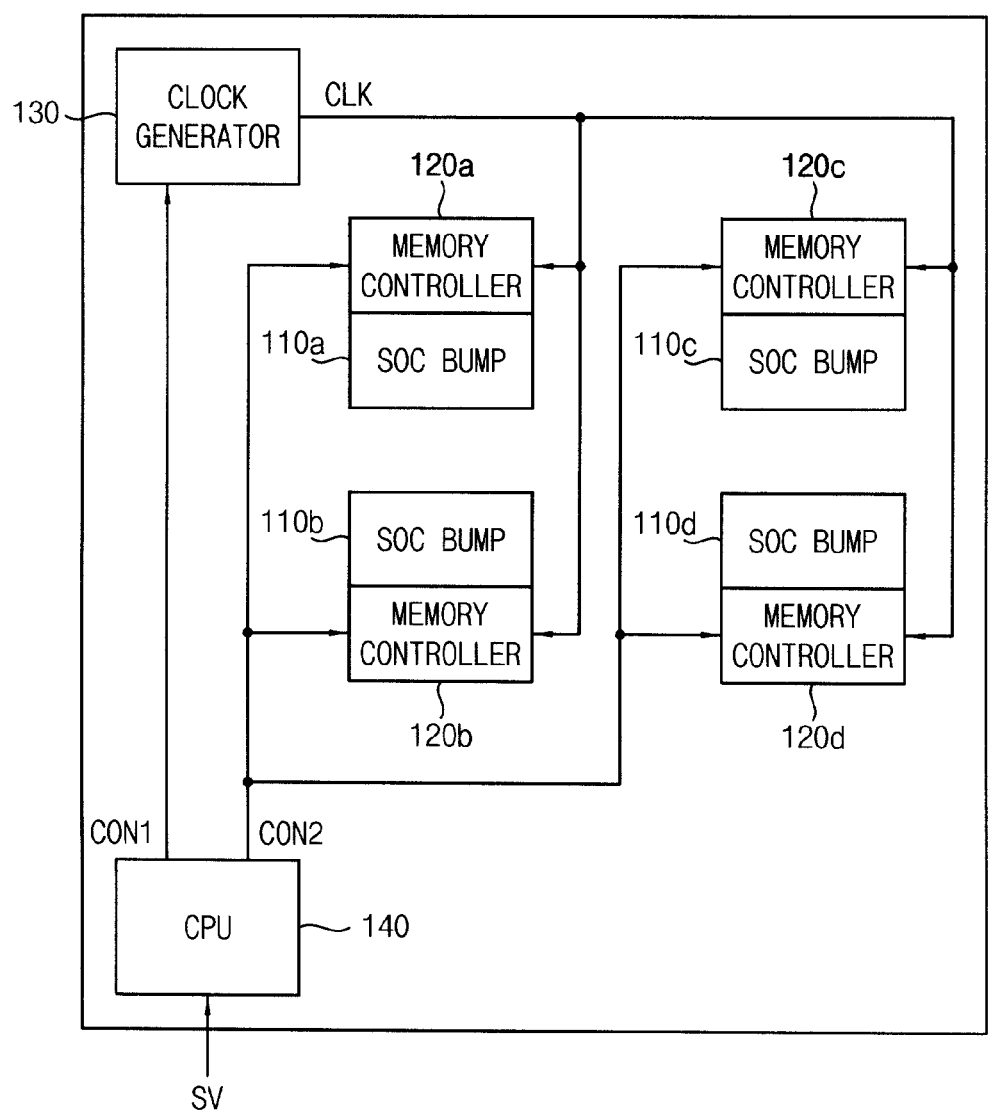
FIG. 5 is a block diagram of one example of the system-on-chip of a semiconductor device according to the inventive concept.

FIG. 5 illustrates one example of the system-on-chip that may be employed by both of the semiconductor devices of FIGS. 2 and 3.

Referring to FIG. 5, in addition to the first to fourth SOC bump groups 110a to 110d, the system-on-chip 100 of this example includes first to fourth memory controllers 120a to 120d, a clock signal generator 130 and a central processing unit (CPU) 140.

As has already been mentioned above, the first to fourth SOC bump groups 110a to 110d provide first to fourth input/output channels which are independent from each other.

The CPU 140 controls an operation of the clock signal generator 130 using a first control signal CON1 and controls operations of the first to fourth memory controllers 120a to 120d using a second control signal CON2.

The clock signal generator 130 provides a clock signal CLK to the first to fourth memory controllers 120a to 120d. The clock signal CLK generated from the clock signal generator 130 may have the same frequency as an operation frequency of a wide input/output memory device stacked on the system-on-chip 100. The clock signal generator 130 may determine the frequency of the clock signal CLK based on the first control signal CON1.

The first to fourth memory controllers 120a to 120d are connected to the first to fourth SOC bump groups 110a to 110d, respectively. Each of the first to fourth memory controllers 120a to 120d can independently conduct data communications with the wide input/output memory device 200 stacked on the system-on-chip 100 through each of the first to fourth SOC bump groups 110a to 110d in synchronization with the clock signal CLK provided by the clock signal generator 130. The first to fourth memory controllers 120a to 120d may determine an operation protocol based on the second control signal CON2. For example, the first to fourth memory controllers 120a to 120d may be operated through an SDR (Single Data Rate) scheme or a DDR (Double Data Rate) scheme based on the second control signal CON2.

The CPU 140 may generate the first and second control signals CON1 and CON2 based on a setting value SV received from an external device. The setting value SV may indicate whether the semiconductor device 10 has just one of the memory devices as in the case of the device of FIG. 2 or more than one memory device as in the case of the device of FIG. 3.

Figure 6:
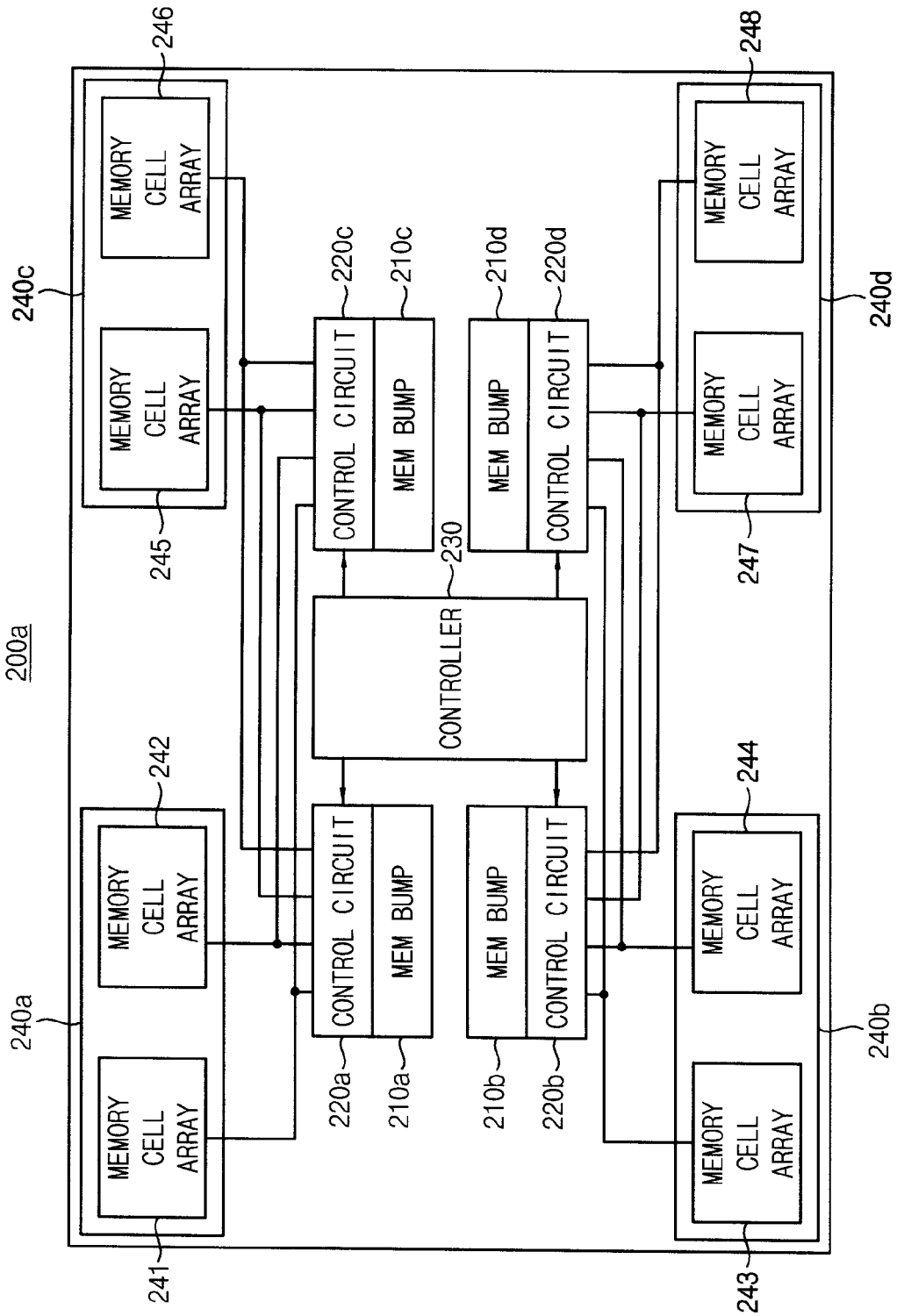
FIG. 6 is a block diagram of an example of a wide input/output memory device, one or two of which is provided in a semiconductor device according to an aspect of the inventive concept illustrated by FIGS. 2 and 3.
Figure 7:
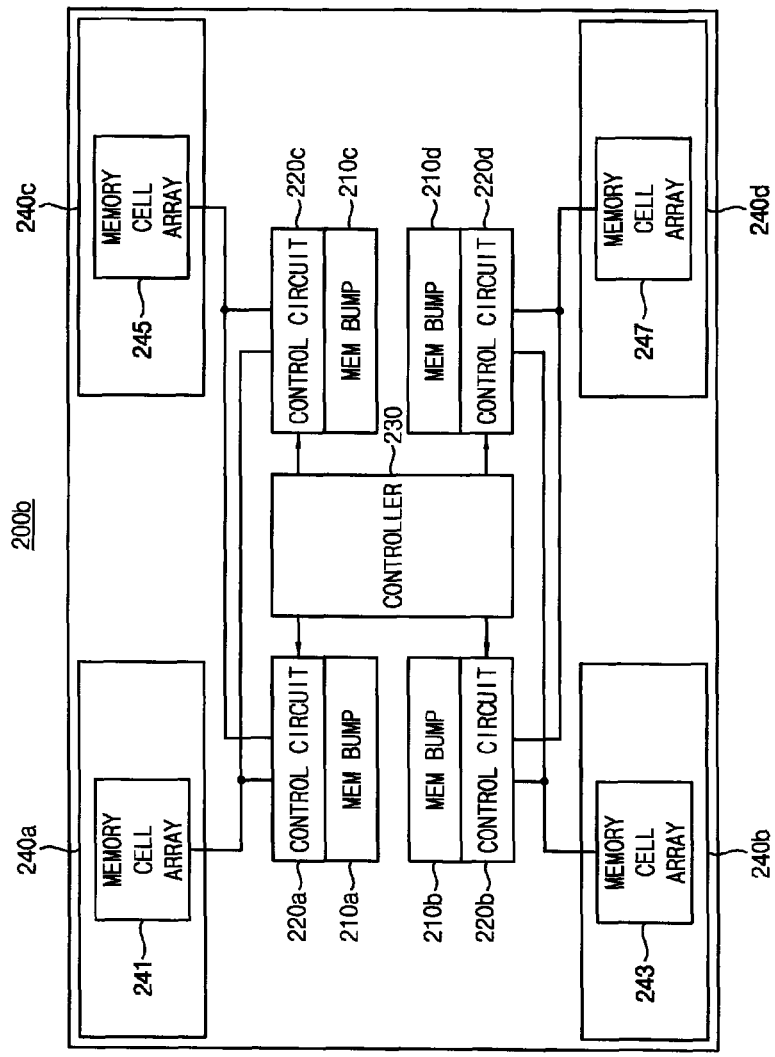
FIG. 7 is a block diagram of another example of a wide input/output memory device, one or two of which is provided in a semiconductor device also according to the aspect of the inventive concept illustrated by FIGS. 2 and 3.

FIGS. 6 and 7 are block diagrams of different examples of a wide input/output memory device 200a and 200b that may be employed in the semiconductor device of FIG. 2 or in multiple in the semiconductor device of FIG. 3.

Referring to FIGS. 6 and 7, in addition to the first to fourth memory bump groups 210a to 210d, both examples of the wide input/output memory device 200a and 200b include first to fourth control circuits 220a to 220d, a controller 230 and first to fourth memory cell array blocks 240a to 240d. Again, as has been mentioned above, the first to fourth memory bump groups 210a to 210d provide first to fourth input/output channels which are independent from each other.

The first to fourth memory cell array blocks 240a to 240d each include at least one memory cell array, respectively. In the example shown in FIG. 6, each of the first to fourth memory cell array blocks 240a to 240d includes two memory cell arrays for a total of eight memory cell arrays 241 to 248. In the example shown in FIG. 7, each of the first to fourth memory cell array blocks 240a to 240d includes one memory cell array 241, 243, 245 or 247. The wide input/output memory device 200b illustrated in FIG. 7 is identical to the wide input/output memory device 200a illustrated in FIG. 6 except for the number of memory cell arrays constituting each of the first to fourth memory cell array blocks 240a to 240d. Therefore, only the remainder of the wide input/output memory device 200a illustrated in FIG. 6 will be described in detail, for the sake of brevity.

The controller 230 may control the operations of the first to fourth control circuits 220a to 220d. For example, the controller 230 may provide a clock signal to the first to fourth control circuits 220a to 220d to establish the operating protocol of the first to fourth control circuits 220a to 220d.

The first to fourth control circuits 220a to 220d are connected to the first to fourth memory bump groups 210a to 210d, respectively, and thus may independently conduct data communications with the system-on-chip 100 through the first to fourth memory bump groups 210a to 210d, respectively.

The memory cell arrays 241, 242, 245 and 246 of the first and third memory cell array blocks 240a and 240c are commonly connected to the first and third control circuits 220a and 220c, and the memory cell arrays 243, 244, 247 and 248 of the second and fourth memory cell array blocks 240b and 240d are commonly connected to the second and fourth control circuits 220b and 220d.

In the case in which just one of the wide input/output memory devices 200a is stacked on the system-on-chip 100 (FIG. 2), the first to fourth memory bump groups 210a to 210d of the wide input/output memory device 200 are connected to the first to fourth SOC bump groups 110a to 110d of the system-on-chip 100, respectively. Thus, the controller 230 turns on all of the first to fourth circuits 220a to 220d so that the one wide input/output memory device 200 may conduct 4-channel data communications. That is, the first control circuit 220a may facilitate data communications between the memory cell arrays 241 and 242 of the first memory cell array block 240a and the system-on-chip 100 through the first memory bump group 210a. The second control circuit 220b may facilitate data communications between the memory cell arrays 243 and 244 of the second memory cell array block 240b and the system-on-chip 100 through the second memory bump group 210b. The third control circuit 220c facilitates data communications between the memory cell arrays 245 and 246 of the third memory cell array block 240c and the system-on-chip 100 through the third memory bump group 210c. And, the fourth control circuit 220d facilitates data communications between the memory cell arrays 247 and 248 of the fourth memory cell array block 240d and the system-on-chip 100 through the fourth memory bump group 210d.

On the other hand, in the case in which two of the wide input/output memory devices 200a are stacked on the system-on-chip 100 (FIG. 3), two of the memory bump groups 210a to 210d of each wide input/output memory device 200a are connected to a respective pair of the SOC bump groups 110a to 110d of the system-on-chip 100, respectively. In this case, the controller 230 turns on the first and second circuits 220a and 220b and turns off the third and fourth circuits 220c and 220d, so that each wide input/output memory device 200 may conduct 2-channel data communications. That is, on the one hand, the first control circuit 220a may facilitate the data communications between the memory cell arrays 241, 242, 245 and 246 of the first and third memory cell array blocks 240a and 240c and the system-on-chip 100 through the first memory bump group 210a. On the other hand, the second control circuit 220b may facilitate the data communications between the memory cell arrays 243, 244, 247 and 248 of the second and fourth memory cell array block 240b and 240d and the system-on-chip 100 through the second memory bump group 210b.

To summarize, as shown in and described above with reference to FIG. 2, the semiconductor device 10a is configured by stacking one wide input/output memory device 200 on the system-on-chip 100 and the wide input/output memory device 200 may conduct data communications with the system-on-chip 100 using four channels. Meanwhile, as shown in and described with reference to FIG. 3, using the same type of system-on-chip 100 and a plurality of identical wide input/output memory devices, the semiconductor device 10b is configured by stacking two wide input/output memory devices 200-1 and 200-2 on the system-on-chip 100 and each of the two wide input/output memory devices 200-1 and 200-2 may conduct data communications with the system-on-chip 100 using two channels. Thus, the bandwidth between the system-on-chip 100 and the wide input/output memory device 200 is the same in both instances, but the density of the latter semiconductor device (FIG. 3) is twice that of the former (FIG. 2). Therefore, according to an aspect of the inventive concept, semiconductor devices including the same type of system-on-chip and various densities of wide input/output memory devices may be provided, i.e., it is not necessary to fabricate different types of system-on-chips designed according to the density of the wide input/output memory devices to be stacked thereon.

Rather, according to one embodiment of the inventive concept, the controller 230 of the wide input/output memory device 200 provides a clock signal having a first frequency to the first to fourth control circuits 220a to 220d, to provide an operational semiconductor device 10a of the type shown in and described with reference to FIG. 2. On the other hand, the controller 230 of each of two wide input/output memory devices 200-1 and 200-2 turns off their third and fourth control circuits 220c and 220d and provides a clock signal having a second frequency twice as high as the first frequency to the first and second control circuits 220a and 220b, to provide an operational semiconductor device 10b of the type shown in and described with reference to FIG. 3.

Also, in this embodiment, the clock signal generator 130 of the system-on-chip 100 may provide the clock signal CLK having the first frequency to the first to fourth memory controllers 120a to 120d based on the first control signal CON1 to provide an operational semiconductor device 10a of the type shown in and described with reference to FIG. 2. On the other hand, the clock signal generator 130 of the system-on-chip 100 may provide the clock signal CLK having the second frequency (twice that of the first frequency) to the first to fourth memory controllers 120a to 120d to provide an operational semiconductor device 10b of the type shown in and described with reference to FIG. 3.

In either case, therefore, the first to fourth memory controllers 120a to 120d of the system-on-chip 100 and the first to fourth control circuits 220a to 220d of the wide input/output memory device 200 are operated in synchronization with the clock signal.

In another embodiment, the controller 230 of the wide input/output memory device 200 controls the first to fourth control circuits 220a to 220d through an SDR (Single Date Rate) scheme to provide an operational semiconductor device 10a of the type shown in and described with reference to FIG. 2. On the other hand, the controller 230 of each of two wide input/output memory devices 200-1 and 200-2 turns off their third and fourth control circuits 220c and 220d and controls the first and second circuits 220a and 220b through a DDR (Double Data Rate) scheme to provide an operational semiconductor device 10b of the type shown in and described with reference to FIG. 3.

In this case, the first to fourth memory controllers 120a to 120d of the system-on-chip 100 are operated in the SDR scheme based on the second control signal CON2 to provide an operational semiconductor device 10a of the type shown in and described with reference to FIG. 2, and are operated in the DDR scheme based on the second control signal CON2 to provide an operational semiconductor device 10b of the type shown in and described with reference to FIG. 3.

Thus, the first to fourth memory controllers 120a to 120d of the system-on-chip 100 and the first to fourth control circuits 220a to 220d of the wide input/output memory device 200 may transmit/receive data through the SDR scheme to provide an operational semiconductor device 10a of the type shown in and described with reference to FIG. 2, and may transmit/receive data through the DDR scheme to provide an operational semiconductor device 10b of the type shown in and described with reference to FIG. 3.

In either of the two embodiments described above, one or two wide input/output memory device can be stacked on the same system-on-chip to selectively provide semiconductor devices of different memory densities, and different bandwidths for their system-on-chip. Thus, there is no need to fabricate different types of system-on-chips, i.e., system-on-chips designed differently according to the density and bandwidth of the final device.

Figure 8:
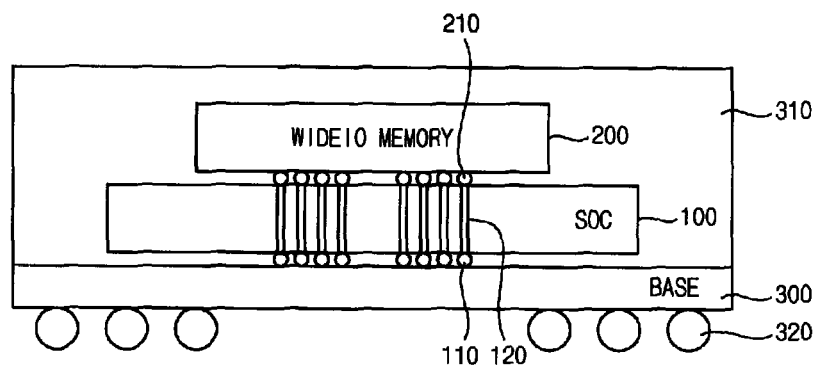
FIG. 8 is a sectional view of an embodiment a semiconductor package according to the inventive concept.

FIG. 8 illustrates an example a semiconductor package according to the inventive concept.

Referring to FIG. 8, the semiconductor package 20 includes a base substrate 300, a system-on-chip 100 stacked on the base substrate 300 and at least one wide input/output memory device 200 stacked on the system-on-chip 100.

The base substrate 300 may be a printed circuit board (PCB). The system-on-chip 100 may include an application processor.

The system-on-chip 100 includes a plurality of SOC bump groups, which provide input/output channels independent from each other. Each of the SOC bump groups may include a plurality of SOC bumps 110. The system-on-chip 100 is electrically connected to the base substrate 300 through the SOC bumps 110.

The at least one wide input/output memory device 200 includes a plurality of memory bump groups, which provide input/output channels independent from each other. Each of the memory bump groups may include a plurality of memory bumps 210. The at least one wide input/output memory device 200 is electrically connected to the system-on-chip 100 through the memory bumps 210. The at least one wide input/output memory device 200 transmits/receives data to/from the system-on-chip 100 through the SOC bumps 110 of the system-on-chip 100.

In one form of the package, one wide input/output memory device 200 is connected to all of the SOC bump groups to transmit/receive data to/from the system-on-chip 100. In another form of the package, two wide input/output memory devices 200 are connected to first and second halves of the SOC bump groups, respectively, to transmit/receive data to/from the system-on-chip 100.

The circuits of the system-on-chip 100 are connected to the plurality of SOC bumps 110 by through-silicon vias (TSV)

120 extending through the substrate of the system-on-chip 100. The memory bumps 210 are connected to the TSVs 120 so that at least one wide input/output memory device 200 is electrically connected to the system-on-chip 100. In this case, an interface load resistance between the base substrate 300 and the wide input/output memory device(s) 200 may be reduced so that smooth signal transmission may be realized.

In the package 20, the system-on-chip 100 and at least one wide input/output memory device 200 may be constituted by any of the semiconductor devices described above with reference to FIGS. 1 to 7.

After stacking the system-on-chip 100 and the at least one wide input/output memory device 200 on the base substrate 300, a top surface of the resulting structure may be coated with resin. That is, the package 20 may have a resin encapsulant 310 encapsulating the system-on-chip 100 and the at least one wide input/output memory device 200 on the base substrate 300. External bumps 320 for facilitating an electrical connection with an external device may be disposed on a bottom surface of the base substrate 300 (and connected to the SOC bumps 110 by wiring such as a redistribution layer and conductive vias (not shown)).

Also, as shown in FIG. 8, the semiconductor package 20 employs a flip-chip packaging technique. In the flip-chip packaging technique, the memory bumps 210 on a surface of the wide input/output memory device(s) 200 serve as electrodes, and the SOC bumps 110 of the system-on-chip 100 are disposed at positions corresponding to those of the memory bumps 210, so that wires are not used to connecting the wide input/output memory device(s) 200 to the system-on-chip 100.

Figure 9:
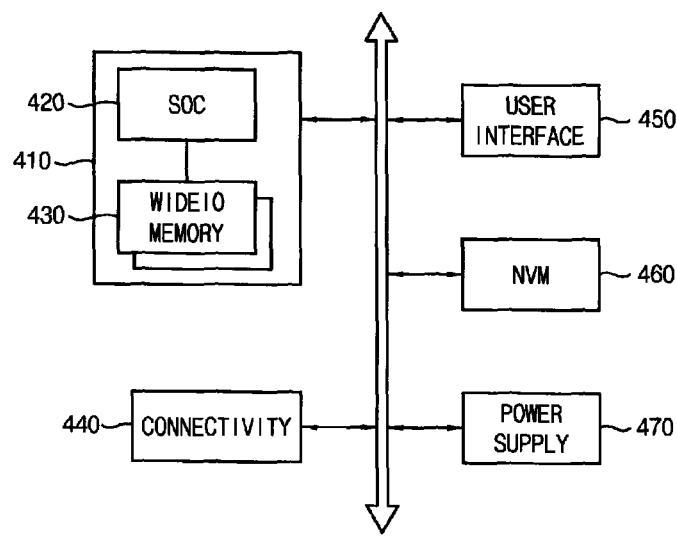
FIG. 9 is a block diagram of a mobile system employing a semiconductor package according to the inventive concept.

FIG. 9 illustrates an example of a mobile system 400 including a semiconductor package 410 according to the inventive concept (e.g., of the type shown in and described with reference to FIG. 8). Thus, the semiconductor package 410 includes a system-on-chip SOC 420 and at least one wide input/output device 430. The mobile system 400 also includes a connectivity unit 440, a user interface 450, a nonvolatile memory device NVM 460 and a power supply 470. The mobile system 400 may be embodied as a mobile phone such as a smart phone, a personal digital assistant (PDA), a portable multimedia player (PMP), a digital camera, a music player, a portable game console, a navigation system, or the like.

The system-on-chip 420 of the mobile system 400 includes an application processor that may execute applications such as a web browser, a video game, a video player or the like. To these ends, the application processor may include a single core or multiple cores. For example, the application processor may be a multi-core processor, such as a dual-core processor, a quad-core processor, or a hexa-core processor. The application processor may also include an internal or external memory cache.

The connectivity unit 440 may facilitate wired or wireless communications with an external device. For example, the connectivity unit 440 may facilitate an Ethernet communication, near field communication (NFC), radio frequency identification (RFID) communication, mobile telecommunication, memory card communication, or universal serial bus (USB) communication. Furthermore, the connectivity unit 440 may include a baseband chipset that supports communications, such as a global system for mobile communications (GSM), a general packet radio service (GPRS), a wideband code division multiple access (WCDMA), or a high speed downlink/uplink packet access (HSxPA).

The nonvolatile memory device 460 may store data for booting the mobile system 400. To this and/or other ends, the nonvolatile memory device 460 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), or a ferroelectric random access memory (FRAM).

The user interface 450 may include at least one input device such as a keypad or a touch screen, and at least one output device such as a speaker or a display device. The power supply 470 supplies a power supply voltage to the mobile system 400.

The mobile system 400 may also include other peripherals such as an image processor and/or a storage device such as a memory card, a solid state drive (SSD), a hard disk drive (HDD) or a CD-ROM.

Also, the mobile system 400 and/or select components of the mobile system 400 may be integrated in the form of a package such as a package on package (PoP), ball grid arrays (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A semiconductor device comprising:
a system-on-chip (SOC) having a plurality of input/output channels independent from each other and having terminal ends; and
a plurality of wide input/output memory devices stacked side-by-side on the system-on-chip,
wherein each of the wide input/output memory devices has a substrate, a memory, and a plurality of memory bump groups,
the substrate of each of the wide input/output memory device has a surface,
each of the memory bump groups comprises a plurality of spaced apart electrically conductive memory bumps disposed on the surface of the substrate and electrically connected to at least one memory array,
the plurality of memory bumps of some of the memory bump groups of each of the wide input/output memory devices are electrically connected to a respective fraction of the input/output channels of the system-on-chip at the terminals ends of the channels, whereas all of the memory bumps of others of the memory bump groups of each of the wide input/output memory devices are not electrically connected to any of the input/output channels of the system-on-chip and are electrically inactive in the semiconductor device, whereby each of the wide input/output memory devices transmits/receives data to/from the system-on-chip via only some of its memory bump groups, and the total number and layout of the memory bumps of the wide input/output memory devices are the same as the total number and layout of the terminal ends of the input/output channels of the system-on-chip.

2. The semiconductor device of claim 1, wherein the memory of each of the wide input/output memory devices comprises a plurality of memory cell arrays, and the memory bump groups are connected to the memory cell arrays, respectively, to provide input/output channels independent from each other.

3. The semiconductor device of claim 2, wherein the system-on-chip comprises an SOC chip substrate, and four SOC bump groups, each of which has a plurality of SOC bumps disposed on a surface of the SOC chip substrate and electrically connected to a processor, and the four SOC bump groups provide four input/output channels independent from each other,
the semiconductor device has two of said wide input/output memory devices stacked side-by-side on the system-on-chip, and
each of the wide input/output memory device has four memory bump groups only two of which are electrically connected to a respective pair of the input/output channels of the system-on-chip.

4. The semiconductor device of claim 3, wherein each of the wide input/output memory devices further comprises:
four control circuits electrically connected to the memory bump groups, respectively, to transmit/receive data to/from the memory bump groups, respectively; and
a controller configured to control operations of the control circuits.

5. The semiconductor device of claim 4, wherein each of the wide input/output memory devices has four memory cell array blocks each of which comprises at least one of the memory cell arrays, and
the memory cell arrays of first and third ones of the memory cell array blocks are electrically connected in common to first and third ones of the control circuits, and the memory cell arrays of second and fourth ones of the memory cell array blocks are electrically connected in common to second and fourth ones of the control circuits.

6. The semiconductor device of claim 5, wherein the third and fourth control circuits are turned off, the first control circuit conducts data communications between the first and third memory cell array blocks and the system-on-chip through the first memory bump group, and the second control circuit conducts data communications between the second and fourth memory cell array blocks and the system-on-chip through the second memory bump group.

7. The semiconductor device of claim 6, wherein the system-on-chip has a clock signal generator operative to produce clock signals of various frequencies, and the wide input/output memory devices are both operated in synchronization with clock signals of the same frequency generated by the clock signal generator.

8. The semiconductor device of claim 6, wherein the wide input/output memory devices are operated through a double data rate (DDR) scheme.

9. The semiconductor device of claim 1, wherein the system-on-chip comprises:
a chip substrate, and a plurality of SOC bump groups each of which has a plurality of SOC bumps disposed on a surface of the chip substrate, the SOC bump groups constituting the channels of the system-on-chip, respectively.

10. The semiconductor device of claim 9, wherein the system-on-chip further comprises:
a plurality of memory controllers electrically connected to the SOC bump groups, respectively;
a clock signal generator configured to provide a clock signal to the memory controllers; and
a central processing unit (CPU) configured to control an operation of the clock signal generator with a first control signal and to control operations of the memory controllers using a second control signal.

11. The semiconductor device of claim 10, wherein the clock signal generator is operative to generate a clock signal having a first frequency based on the first control signal in a first mode, and to generate a clock signal having a second frequency twice that of the first frequency based on the first control signal in a second mode.

12. The semiconductor device of claim 10, wherein the memory controllers are operatable through a single data rate (SDR) scheme in a first mode and through a double data rate (DDR) scheme in a second mode, based on the second control signal.

13. The semiconductor device of claim 10, wherein the central processing unit is configured to selectively generate the first and second control signals based on a setting value received from an external device.

14. The semiconductor device of claim 9, wherein the system-on-chip further has through-silicon vias connected to the SOC bumps and electrically connected to the wide input/output memory devices.

15. A semiconductor package comprising the semiconductor device as claimed in claim 1, and further comprising a base substrate, and
wherein the system-on-chip is stacked on the base substrate, and the system-on-chip includes an SOC substrate, a plurality of SOC bump groups each of which has a plurality of SOC bumps disposed on a surface of the SOC substrate, and through-silicon vias extending through the SOC substrate and electrically connected to the SOC bumps, the SOC bumps and through-vias constituting the input/output channels of the system-on-chip, and the base substrate being electrically connected to the system-on-chip at the SOC bumps.

16. The semiconductor device of claim 1, wherein the surface of the substrate on which the memory bumps of the plurality of memory bump groups are disposed faces the system-on-chip.

* * * * *